United States Patent [19]
Liao

[11] Patent Number: 5,994,197
[45] Date of Patent: Nov. 30, 1999

[54] METHOD FOR MANUFACTURING DYNAMIC RANDOM ACCESS MEMORY CAPABLE OF INCREASING THE STORAGE CAPACITY OF THE CAPACITOR

[75] Inventor: Kuan-Yang Liao, Taipei, Taiwan

[73] Assignees: United Silicon Incorporated; United Microelectronics Corp., both of Hsinchu, Taiwan

[21] Appl. No.: 09/322,058

[22] Filed: May 27, 1999

[51] Int. Cl.$^6$ .............................. H01L 21/20; H01G 4/06
[52] U.S. Cl. ..................... 438/396; 438/239; 438/253; 257/300; 257/303; 257/306; 257/532
[58] Field of Search ..................... 438/149, 171, 438/190, 239, 243, 244, 250, 253, 386, 387, 393, 396; 257/296, 300, 303, 304, 306, 308, 309, 307, 295, 532, 534, 535, 310, 900

[56] References Cited

U.S. PATENT DOCUMENTS

| | | | |
|---|---|---|---|
| 5,418,388 | 5/1995 | Okudaira et al. | 257/295 |
| 5,621,606 | 4/1997 | Hwang | 361/321 |
| 5,693,553 | 12/1997 | Kashihara et al. | 437/52 |
| 5,792,691 | 6/1997 | Koga | 438/233 |
| 5,796,136 | 3/1996 | Shinkawata | 257/306 |
| 5,937,307 | 8/1999 | Jenq et al. | 438/398 |

*Primary Examiner*—Donald L. Monin, Jr.
*Assistant Examiner*—Hoai V. Pham
*Attorney, Agent, or Firm*—Jiawei Huang; J.C. Patents

[57] ABSTRACT

A method for manufacturing the capacitor of a dynamic random access memory cell. The method includes the steps of first providing a substrate having field effect transistors thereon, and then forming a dielectric layer over the substrate. Next, a contact opening that exposes the source/drain region is formed in the dielectric layer, and then conductive material is deposited over the substrate, filling the contact opening to form a conductive layer. Thereafter, the conductive layer is patterned, and then a portion of the exposed dielectric layer is removed to form trenches that surround the conductive layer. In the subsequent step, conductive spacers are formed on the sidewalls of the trenches and the conductive layer. The conductive spacers and the conductive layer form the lower electrode structure of a capacitor.

20 Claims, 8 Drawing Sheets

METHOD FOR MANUFACTURING DYNAMIC RANDOM ACCESS MEMORY CAPABLE OF INCREASING THE STORAGE CAPACITY OF THE CAPACITOR

BACKGROUND OF THE INVENTION

1. Field of Invention

The present invention relates to a method for manufacturing integrated circuits. More particularly, the present invention relates to a method for manufacturing dynamic random access memory (DRAM).

2. Description of Related Art

As the microprocessor of a computer becomes more powerful and the size of software programs increase, the demand for a high capacity capacitor in each memory unit is greater. Following the recent increase in integration level for DRAMs, each memory cell now comprises just a transfer field effect transistor and a storage capacitor.

Since a capacitor is the storage center of a DRAM cell, the higher the electric charges stored within a capacitor, the lower the effect of noise on the data reading is. The most common methods of increasing the electric charge storage capacity of a capacitor include increasing the surface area, choosing a material having a high dielectric constant to form the dielectric film layer, or reducing the thickness of the dielectric film layer.

At present, high dielectric constant materials that can be used to form the dielectric film layer include tantalum pentoxide $Ta_2O_5$, Lead-Zirconium-Titanium oxide $Pb(Zr,Ti)O_3$ (PZT), and barium-strontium-titanium oxide $(Ba,Sr)TiO_3$ (BST). Due to the increase in the level of integration for integrated circuits, surface area of a capacitor can only be increased by developing three-dimensional capacitor structures, for example, stacked type or trench type capacitors. For even higher level of integration such as 64 Mb DRAM, the electrode and the dielectric film layer of the capacitor not only extend in a horizontal direction, but also stacked up vertically to form what is known as a fin-type capacitor. Alternatively, the electrode and the dielectric film layer of the capacitor extend to form vertical structure known commonly as a cylindrical-type capacitor.

FIG. 1 is a schematic, cross-sectional diagram showing a conventional cylindrical type capacitor for a DRAM cell. The method of forming the DRAM capacitor includes the steps of first providing a substrate 100 having some isolation regions 102 already formed therein. Next, field effect transistors 104 are formed on the substrate 100, and then a dielectric layer 110 is formed over the substrate 100. Thereafter, contact openings 112 are formed in the dielectric layer 110, exposing a portion of the source/drain region 108. In the subsequent step, an amorphous silicon layer 114 is formed over the dielectric layer 110, filling the contact openings 112 as well. Next, photolithographic and etching operations are conducted in sequence to pattern the amorphous silicon layer 114 above the dielectric layer 110, and hence forming the lower electrode structure of the capacitor. Thereafter, hemispherical grains (HSG) (not shown in the figure) are selectively formed on the surface of the amorphous silicon layer 114 so that surface area of the lower electrode is increased. Finally, a dielectric film layer 116 is formed over the amorphous silicon layer, and then a polysilicon layer 118 that serves as the upper electrode of the capacitor is deposited over the dielectric film layer 116.

To increase the memory holding capacity of each high-density DRAM cell even further, a thicker layer of amorphous silicon is usually deposited. Since an increase in thickness of the amorphous silicon layer can increase the surface area of the lower electrode, the charge storage capacity of the capacitor is also increased.

However, amorphous silicon has a rather low rate of deposition. At present, choosing the production of DRAMs as an example, depositing amorphous silicon to a thickness of about 8000 Å requires roughly 16 hours. Hence, trying to increase the storage capacity of a capacitor by increasing the thickness of the amorphous silicon layer requires a longer depositing time. Therefore, throughput of production is reduced and cost of operating the oven is increased as well. In addition, a thicker amorphous silicon layer increases the difficulties of patterning the layer in an etching operation.

In light of the foregoing, there is a need to improve the method for manufacturing DRAM cells.

SUMMARY OF THE INVENTION

The invention provides a method for manufacturing dynamic random access memory (DRAM) capable of increasing the storage capacity of its capacitor.

The invention also provides a method for manufacturing a DRAM capacitor capable of increasing the overall surface area of the lower electrode is provided so that the storage capacity of the capacitor is increased.

The invention also provides a method for manufacturing a DRAM capable of reducing production time and increasing throughput is provided.

The invention also provides a method for manufacturing DRAM capable of reducing the cost of operating is provided.

To achieve these and other advantages and in accordance with the purpose of the invention, as embodied and broadly described herein, the invention provides a method for manufacturing a DRAM capacitor. A substrate having field effect transistors is provided. A dielectric layer is formed over the substrate. A contact opening that exposes the source/drain region is formed in the dielectric layer, and then conductive material is deposited over the substrate, filling the contact opening to form a conductive layer. Thereafter, the conductive layer is patterned, and then a portion of the exposed dielectric layer is removed to form trenches that surround the conductive layer. In the subsequent step, conductive spacers are formed on the sidewalls of the trenches and the conductive layer. The conductive spacers and the conductive layer form the lower electrode structure of a capacitor. Then, a dielectric film layer is formed over the conductive layer and the conductive spacers. Another conductive layer is formed over the dielectric film layer.

According to the aforementioned description of the embodiment, the step of patterning the conductive layer and the step of forming trenches that surround the conductive layer include the following sub-steps. First, a silicon nitride layer and a photoresist layer are formed in sequence over the conductive layer. Next, the silicon nitride layer and the photoresist layer are patterned, and then the exposed conductive layer and the dielectric layer are etched using the silicon nitride layer as a hard mask. Finally, the silicon nitride layer and the photoresist layer are removed.

Since a high etching selectivity ratio exists between the silicon nitride layer and the conductive layer as well as between the silicon nitride layer and the dielectric layer, the silicon nitride layer can serve as a hard mask layer when the conductive layer and the dielectric layer are etched. Consequently, a thick photoresist layer is unnecessary, and problems resulting from a thick photoresist layer can be avoided in this invention.

Moreover, thickness of both the conductive layer and the conductive spacers are relatively small. Hence, if the conductive layer and the spacers are fabricated using polysilicon, their deposition time in a depositing oven is not long. Hence, product throughput is increased while the cost of operating the deposition oven is lowered.

In addition, hemispherical grained silicon can be formed on the surface of the conductive layer and the conductive spacers to increase the surface area of the lower electrode of a capacitor. Hence, the storage capacity of the capacitor is increased.

This invention also provides a second embodiment for manufacturing a DRAM capacitor. The method includes the steps of first providing a substrate having a field effect transistor thereon, and then forming a dielectric layer over the substrate. Next, a contact opening that exposes the source/drain region is formed in the dielectric layer, and then polysilicon is deposited into the contact opening and over the substrate to form a polysilicon layer. Thereafter, a first barrier layer and then a metallic layer are sequentially formed over the polysilicon layer. Subsequently, the polysilicon layer, the first barrier layer and the first metallic layer are sequentially patterned, and then a portion of the exposed dielectric layer is removed. Ultimately, trenches that surround the polysilicon layer are formed in the dielectric layer. Next, a second barrier layer and a second metallic layer are sequentially formed over the substrate. Then, the second barrier layer and the second metallic layer are etched back to form conductive spacers on the sidewalls of the polysilicon layer, the first barrier layer, the first metallic layer and the trenches. Finally, a dielectric film layer is formed over the first metallic layer and the conductive spacers, and then a conductive layer is formed over the dielectric film layer.

According to the second embodiment of this invention, the step of patterning the polysilicon layer, the first barrier layer and the first metallic layer as well as the step of forming trenches that surround the polysilicon layer in the dielectric layer include the following substeps. First, a silicon nitride layer and a photoresist layer are formed in sequence over the first metallic layer. Thereafter, the silicon nitride layer and the photoresist layer are patterned. Next, the first metallic layer, the first barrier layer, the polysilicon layer and the dielectric layer are etched using the patterned silicon nitride layer and the polysilicon layer as an etching mask. Finally, the silicon nitride layer and the photoresist layer are removed.

A high etching selectivity ratio exists between the silicon nitride layer and the first metallic layer, the first barrier layer, and the polysilicon layer, as well as between the silicon nitride layer and the dielectric layer. Consequently, the silicon nitride layer can serve as a hard mask layer when the first metallic layer, the first barrier layer, the polysilicon layer and the dielectric layer are etched. As a result, a thick photoresist layer is unnecessary, and problems resulting from a thick photoresist layer can be avoided in this invention.

Furthermore, according to the second embodiment of this invention, ruthenium dioxide can be used to form the lower electrode of the capacitor so that capacity of the capacitor can be improved. Moreover, the contact opening is filled using polysilicon, and hence leakage current at the junction between the metallic layer and the source/drain region can be avoided. In addition, materials having a high dielectric constant such as tantalum pentoxide, BST and PZT can also be used to form the dielectric film layer. Hence, the storage capacity of the capacitor is further increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
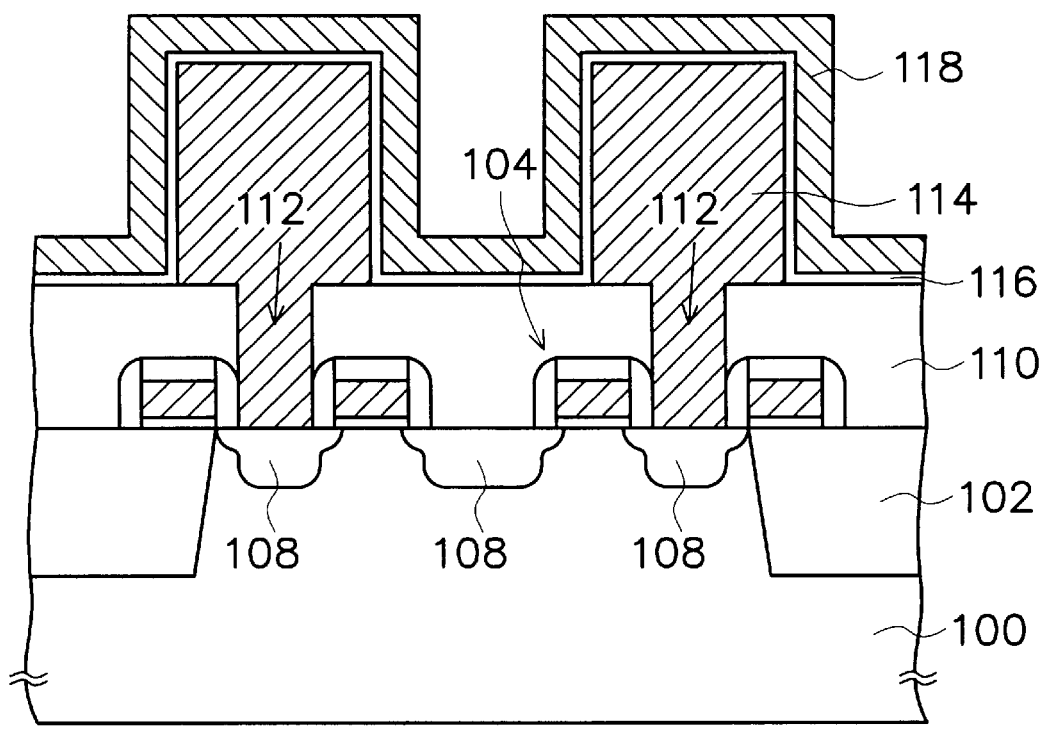
FIG. 1 is a schematic, cross-sectional diagram showing a conventional cylindrical type capacitor of a DRAM cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing the progression of manufacturing steps in producing a DRAM cell that has a cylindrical capacitor according to the first preferred embodiment of this invention.

Figure 2A:
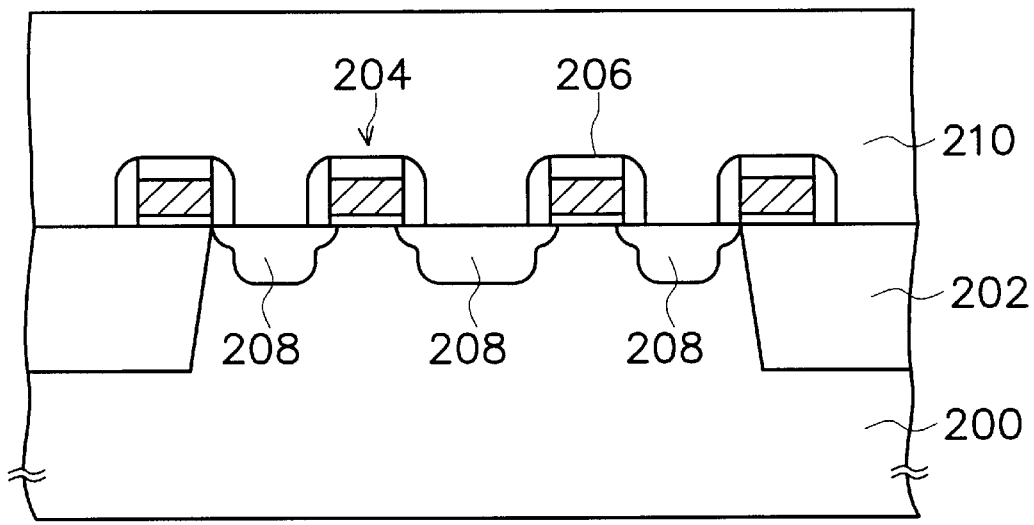
FIGS. 2A through 2E are schematic, cross-sectional views showing the progression of manufacturing steps in producing a DRAM cell according to the first preferred embodiment of this invention.

As shown in FIG. 2A, a substrate 200 such as a P-type silicon substrate is provided. Then, isolation structures 202 are formed in the surface of a substrate 200 to pattern out the active regions for devices. Next, DRAM field effect transistors 204 and bit lines (not shown in the figure) are formed above the active regions. The isolation structures 202 can be formed by a shallow trench isolation (STI) method or a local oxidation of silicon (LOCOS) method. Each field effect transistor 204 includes a gate terminal 206 and a pair of source/drain regions 208. The gate terminal 206 is a composite layer that includes a gate oxide layer, a doped polysilicon layer, a metal silicide layer such as a tungsten silicide ($WSi_2$) layer and a cap layer such as a silicon nitride ($SiN_x$) layer. The gate oxide layer, the doped polysilicon layer, the metal silicide layer and the cap layer preferably have a thickness of about 100 Å, 1000 Å, 1000 Å and 1000 Å, respectively. In addition, spacers are formed on the sidewalls of the gate terminal 206. The spacers are preferably silicon nitride layers formed by first depositing silicon nitride over the substrate 200 to a thickness of about 1500 Å, and then etching back the silicon nitride layer.

Thereafter, a dielectric layer 210 having a thickness of about 3 μm is formed over the substrate 200. The dielectric layer 210 can be, for example, a silicon oxide layer formed by a chemical vapor deposition (CVD) process, a borophosphosilicate glass (BPSG) or a spin-on-glass (SOG) layer formed by a spin-coating method. Next, a chemical-mechanical polishing (CMP) operation is carried out to planarize the dielectric layer 210 so that the dielectric layer 210 has a planar surface for subsequent operation. The planarized dielectric layer 210 preferably has a thickness from the bit line of about 2 μm.

Figure 2B:
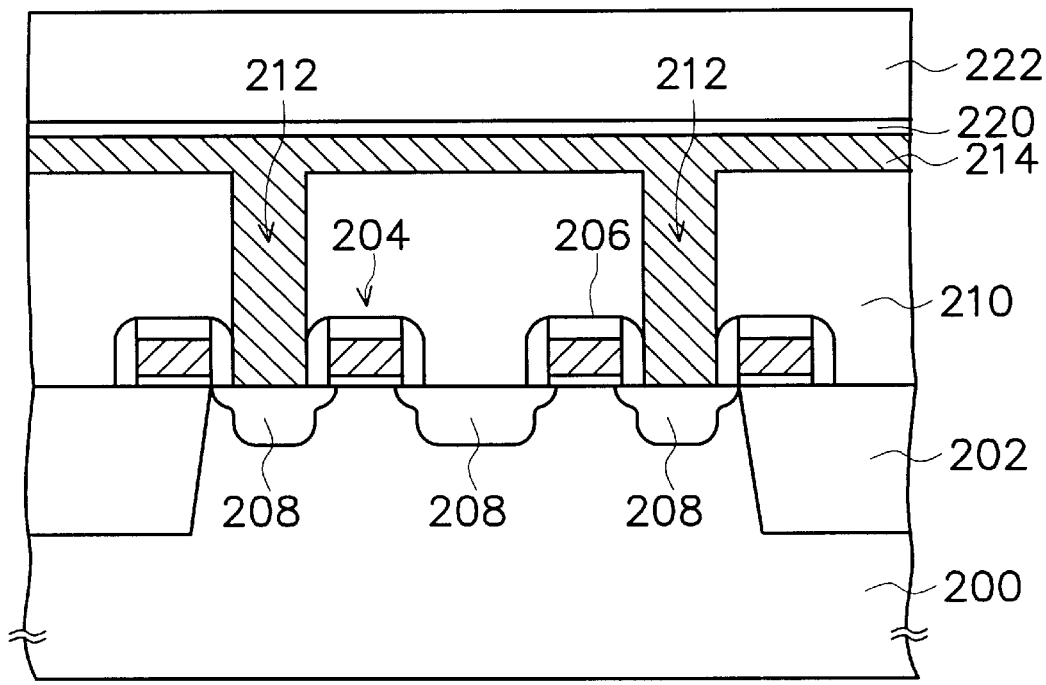

As shown in FIG. 2B, photolithographic and etching processes are carried out to pattern the dielectric layer 210, thereby forming contact openings 212 in the dielectric layer that expose their respective source/drain regions 208. Thereafter, conductive material is deposited over the substrate 200 such that all the contact openings 212 are filled, thus forming a conductive layer 214 that couples with the source/drain regions 208. The conductive layer can be a doped polysilicon layer or an amorphous silicon layer, for example. The conductive layer having a thickness of between 1000 Å to 3000 Å is preferably formed by a chemical vapor deposition (CVD) method. After that, a hard mask layer 220 and a photoresist layer 222 are sequentially formed above the conductive layer 214. The hard mask layer 220 is made from a material that differs from the dielectric layer 210 and the conductive layer 214. Hence, the dielectric layer 210 and the conductive layer 214 have a higher etching selectivity ratio with respect to the hard mask layer 220. The hard mask layer 220 is preferably a silicon nitride layer. The hard mask layer 220 having a thickness of between 100 Å to 1000 Å is formed by depositing silicon nitride using, for example, a chemical vapor deposition (CVD) method.

Figure 2C:
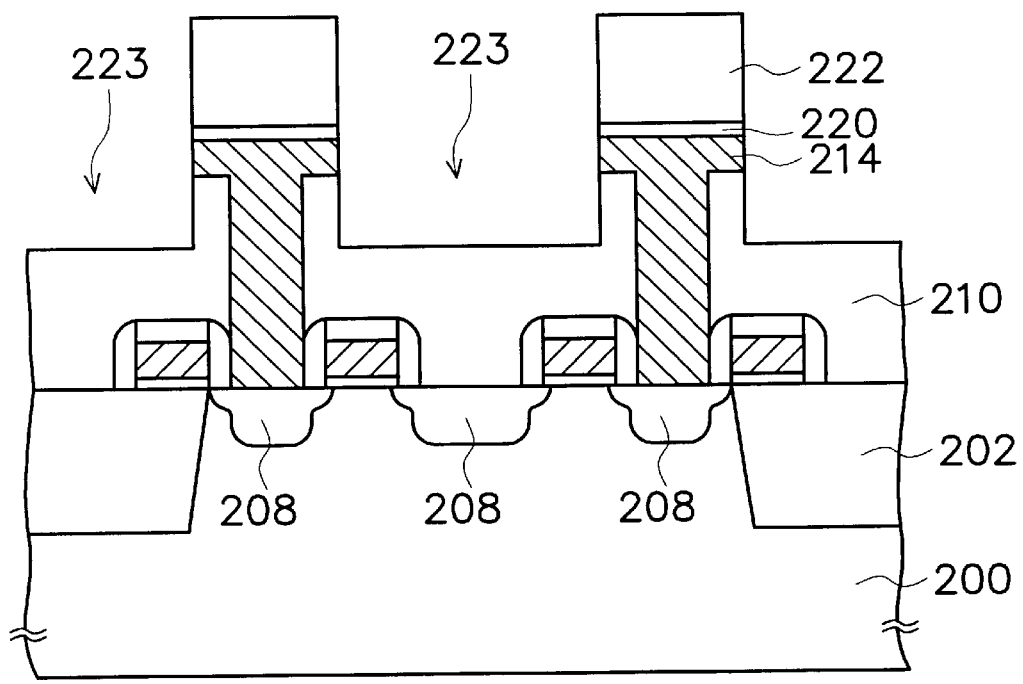

As shown in FIG. 2C, the photoresist layer 222 is patterned. The photoresist layer 222 is patterned in such a way that a patch of photoresist with an area slightly larger than the contact openings 212 always covers the location where each contact opening resides. Thereafter, using the patterned photoresist layer 222 as a mask, the hard mask layer 220 is etched. Subsequently, using the patterned photoresist layer 222 and the hard mask layer 220 as an etching mask, the conductive layer 214 and the dielectric layer 210 are etched in sequence to form a pattern in the conductive layer 214. Ultimately, trenches 223 that surround the conductive layer 214 are formed in the dielectric layer 210. Depth of each trench is preferably between 5000 Å to 15000 Å ce a high etching selectivity ratio exists between the silicon nitride layer 220 and the conductive layer 214 as well as between the silicon nitride layer 220 and the dielectric layer 210, the silicon nitride layer 220 can serve as a hard mask layer when the conductive layer 214 and the dielectric layer 210 are etched. Consequently, a thick photoresist layer 222 is unnecessary, and problems resulting from a thick photoresist layer 222 can be avoided in this invention.

Figure 2D:
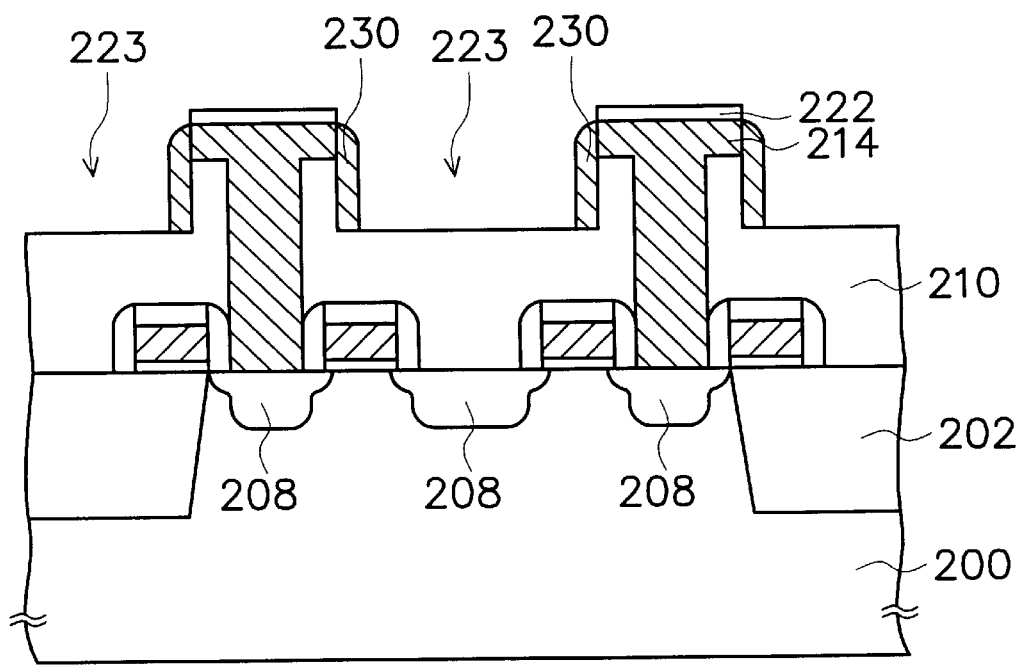

Thereafter, as shown in FIG. 2D, the photoresist layer 222 is removed, and then conductive spacers 230 are formed on the sidewalls of the conductive layer 214 and the trenches 223. The conductive spacers 230, for example, can be a polysilicon layer or an amorphous silicon layer. Therefore, conductive spacers 230 are formed by first depositing polysilicon or amorphous silicon over the substrate 200 using a chemical vapor deposition (CVD) method, and then etching back the deposited polysilicon layer or the amorphous silicon layer.

Figure 2E:
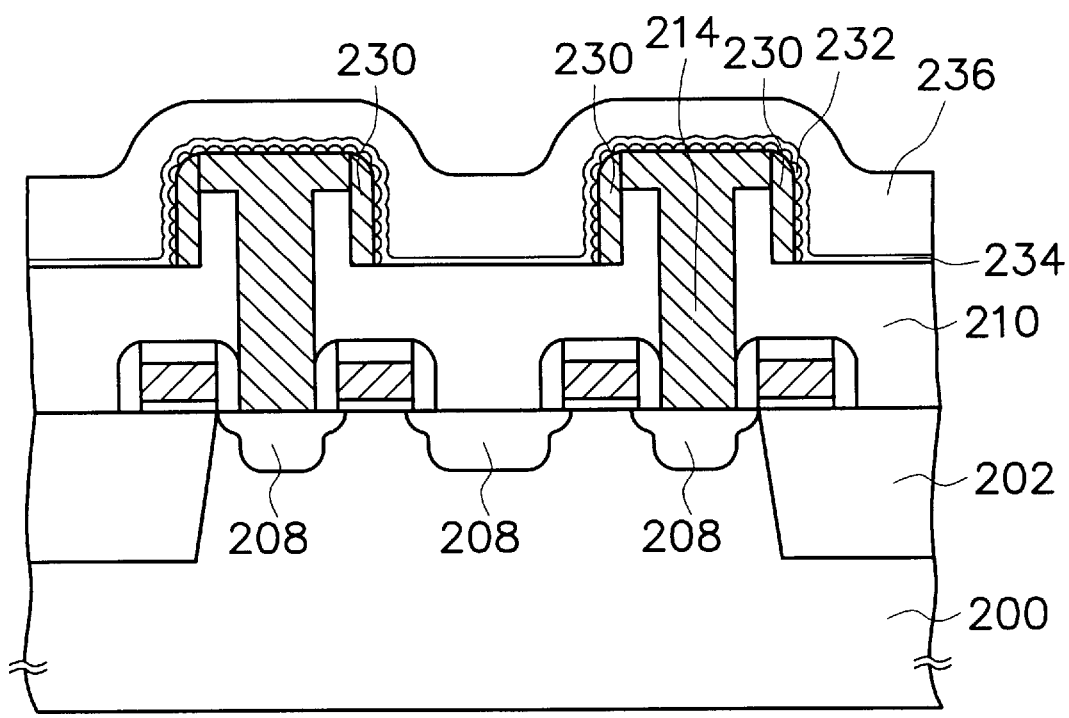

As shown in FIG. 2E, the hard mask layer 220 is removed to expose the conductive layer 214. The hard mask layer 220 can be removed using, for example, hot phosphoric acid solution in a wet etching method. Thereafter, a hemispherical-grained silicon (HSG-Si) layer 232 is formed on the surface of the conductive layer 214 and the conductive spacers 230 so that the overall surface area of the lower electrode is increased. The HSG-Si layer 232 can be formed using a chemical vapor deposition (CVD) method, or alternatively, selective hemispherical silicon grain techniques can be used.

In this invention, the thickness of the conductive layer 214 can be reduced to the height of a contact opening 212, and thickness required for producing the conductive spacers 230 is also relatively small. Therefore, the method of this invention is particularly suitable for the fabrication of a lower electrode with amorphous silicon because the amount of time required for depositing amorphous silicon is greatly reduced. Hence, product throughput increases and the cost of operating an oven decreases.

In addition, since the conductive spacers 230 are formed by an etching back operation, hence no conventional photolithographic and etching operations are required. Consequently, processing problems and hence cost are reduced. Moreover, since the thickness of the conductive layer is only moderate, problems such as breakage of the layer while etching can be prevented.

As shown in FIG. 2E, a dielectric film layer 234 and then another conductive layer 236 are formed over the hemispherical grained silicon layer 232. The dielectric film layer 234 can be a silicon oxide layer, a nitride/oxide (NO) composite layer or an oxide/nitride/oxide (ONO) composite layer, for example. The conductive layer 236 can be a polysilicon layer formed using a chemical vapor deposition (CVD) method, for example.

FIGS. 3A through 3G are cross-sectional views showing the progression of manufacturing steps in producing a DRAM cell according to the second preferred embodiment of this invention.

Figure 3A:
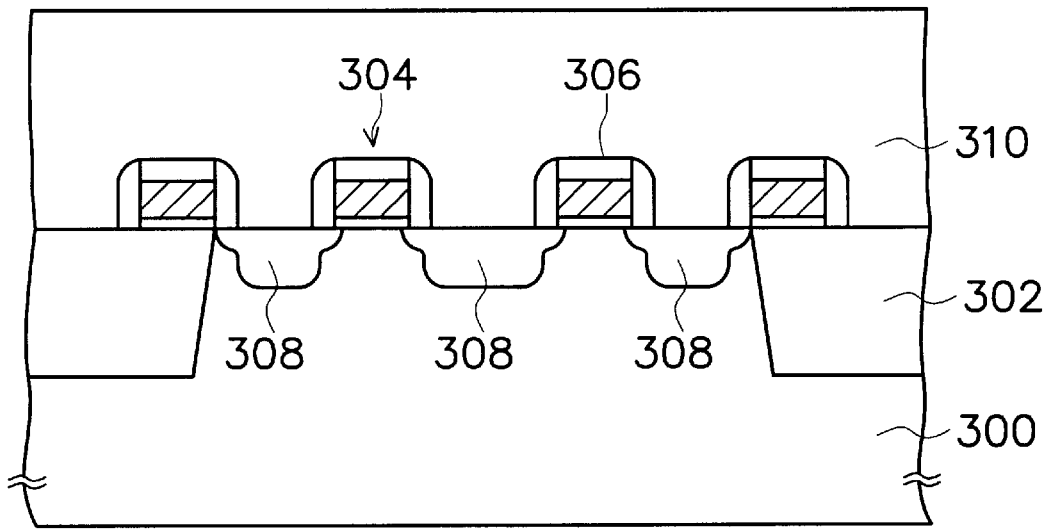
FIGS. 3A through 3G are schematic, cross-sectional views showing the progression of manufacturing steps in producing a DRAM cell according to the second preferred embodiment of this invention.

As shown in FIG. 3A, isolation regions 302, field effect transistors 304, bit lines (not shown) and a dielectric layer 310 are formed on a substrate 300 using similar processes used in the first embodiment.

Figure 3B:
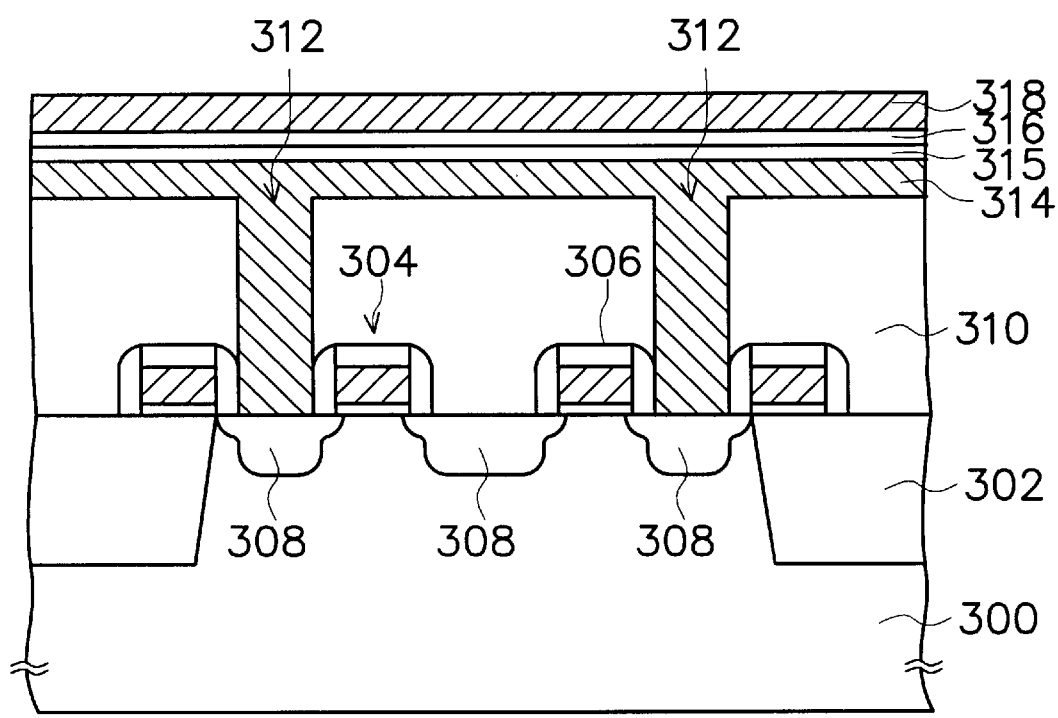

As shown in FIG. 3B, photolithographic and etching techniques are used to pattern the dielectric layer 310 forming contact openings 312. Thereafter, polysilicon is deposited over the substrate 300 and into the contact openings 312 so that a polysilicon layer 314 having electrical connections with the source/drain regions 308 is formed. The polysilicon layer 314 having a thickness of between 1000 Å to 3000 Å is preferably doped using arsenic or phosphorus ions, for example. Subsequently, a metal silicide layer 315, a barrier layer 316 and a metallic layer 318 are sequentially formed over the polysilicon layer 314. The metal silicide layer 315, for example, can be a titanium silicide layer that serves as a contact layer between the polysilicon layer 314 and the barrier layer 316. The barrier layer 316, for example, can be a titanium nitride layer or a composite layer that includes a titanium nitride layer and a ruthenium layer. The titanium nitride layer serves as a metal diffusion barrier layer for the metal, and the ruthenium layer serves as an oxidation barrier layer. The metallic layer 318 serves as a portion of the lower electrode. The metallic layer 318 can be a ruthenium dioxide ($RuO_2$) layer, for example.

Figure 3C:
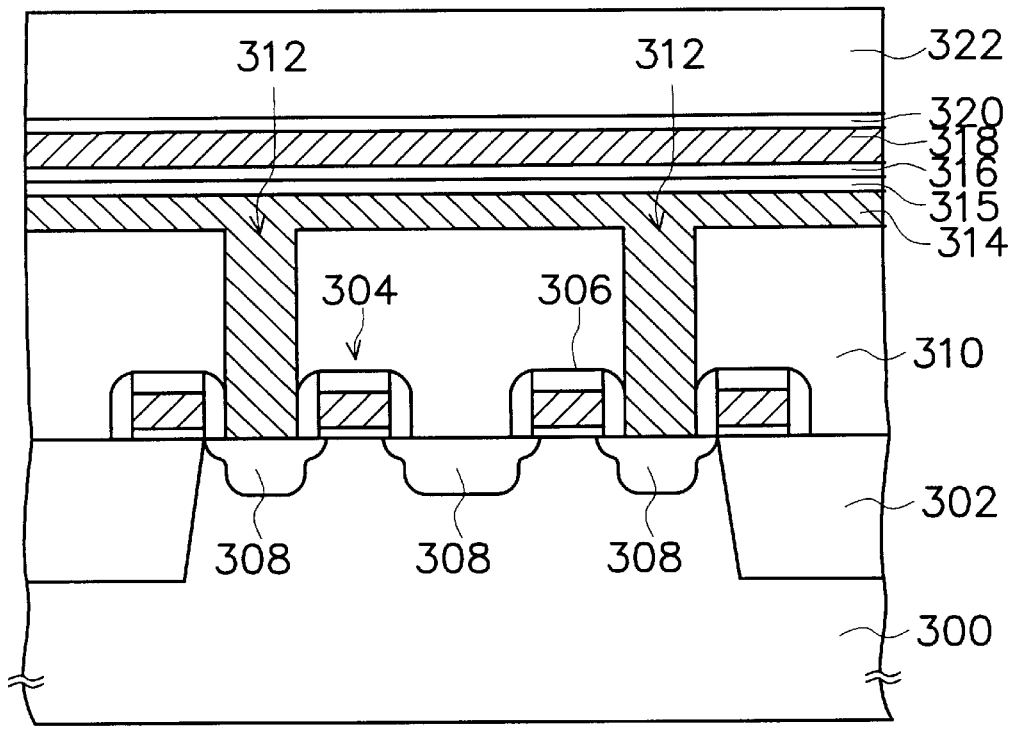

As shown in FIG. 3C, a hard mask layer 320 and a photoresist layer 322 are formed in sequence above the metallic layer 318. The hard mask layer 320 is formed from a material having an etching rate that differs from the dielectric layer 310, the metallic layer 318, the barrier layer 316 and the polysilicon layer 314. The hard mask layer 320, for example, can be a silicon nitride layer having a thickness of between 100 Å to 1000 Å formed using a chemical vapor deposition (CVD) method.

Figure 3D:
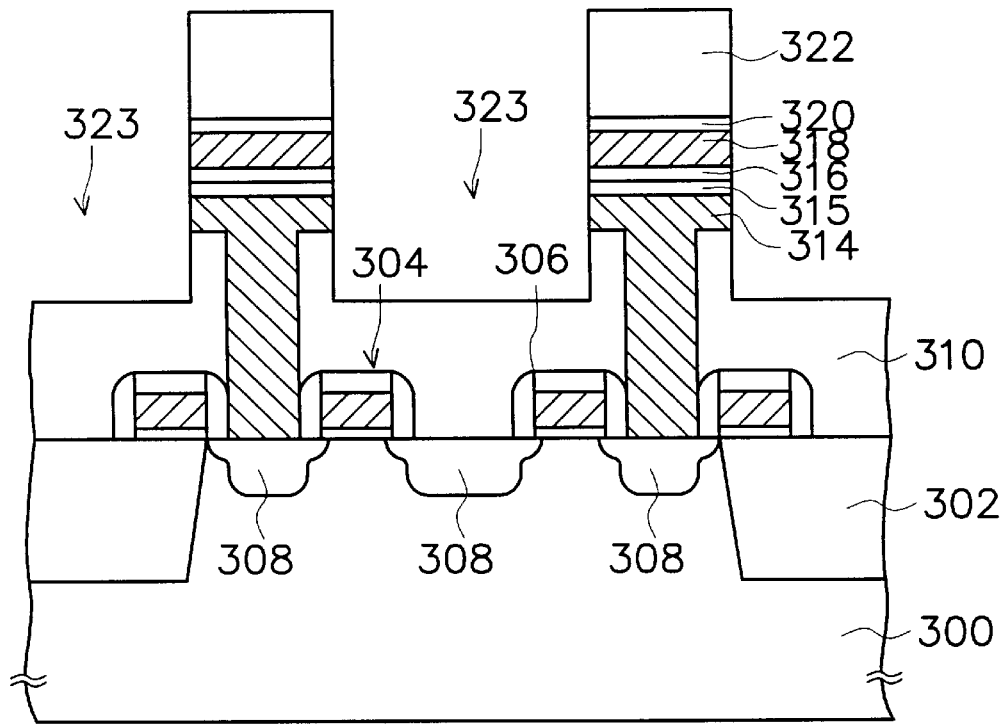

As shown in FIG. 3D, the photoresist layer 322 is patterned. The photoresist layer 322 is patterned in such a way that a patch of photoresist with an area slightly larger than the contact openings 312 always covers the location where each contact opening resides. Thereafter, using the patterned photoresist layer 322 as a mask, the hard mask layer 320 is etched. Subsequently, using the patterned photoresist layer 322 and the hard mask layer 320 as an etching mask, the polysilicon layer 314, the metal silicide layer 315, the barrier layer 316, the metallic layer 318 and the dielectric layer 310 are etched in sequence to form a patterned composite layer including a portion of the polysilicon layer, the metal silicide layer 315, the barrier layer 316 and the metallic layer 318. Ultimately, trenches 323 that surround the polysilicon layer 314 are formed in the dielectric layer 310. Depth of each trench is preferably between 5000 Å to 15000 Å.

Since a high etching selectivity ratio exists between the silicon nitride layer 320 and the polysilicon layer 314, the metal silicide layer 315, the barrier layer 316, the metallic layer 318 as well as between the silicon nitride layer 320 and the dielectric layer 310, the silicon nitride layer 320 can serve as a hard mask layer when the polysilicon layer 314, the metal silicide layer 315, the barrier layer 316, the metallic layer 318 and the dielectric layer 310 are etched. Consequently, a thick photoresist layer 322 is unnecessary, and problems resulting from a thick photoresist layer 322 can be avoided in this invention.

Figure 3E:
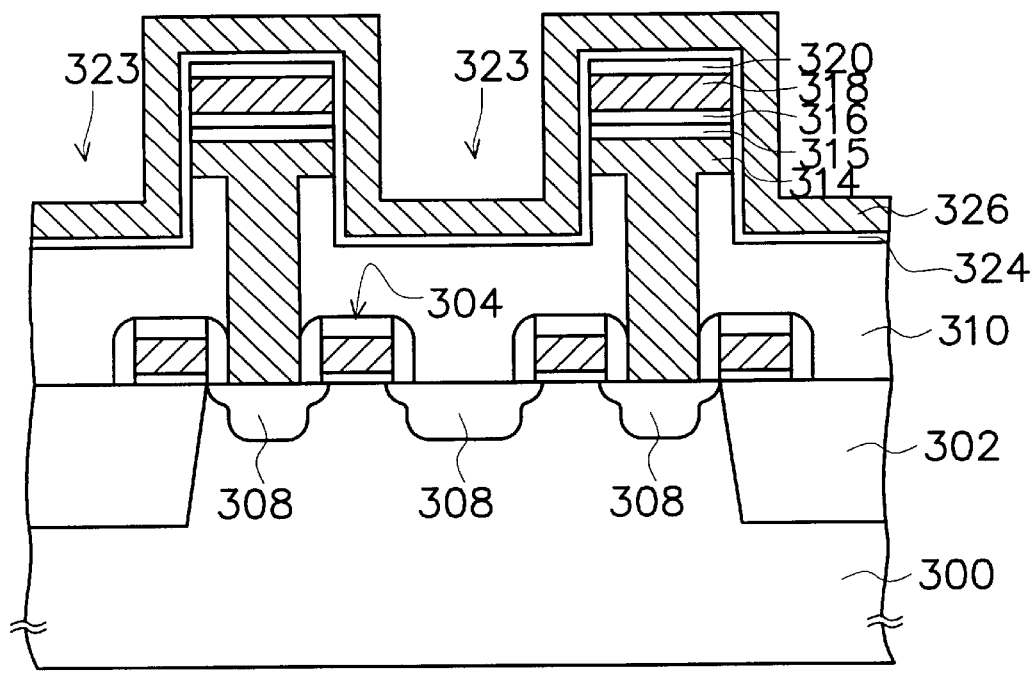

As shown in FIG. 3E, the photoresist layer 322 is removed, and then another barrier layer 324 and another metallic layer 326 are formed in sequence above the substrate 300. The barrier layer 324 can be a titanium nitride layer or a composite layer that includes a titanium nitride layer and a ruthenium layer, for example. The titanium nitride layer serves as a metal diffusion barrier for metal, and the ruthenium layer serves as an oxide barrier. The metallic layer 326 acts as a portion of the lower electrode. The metallic layer 326 can be a ruthenium oxide layer, for example.

Figure 3F:
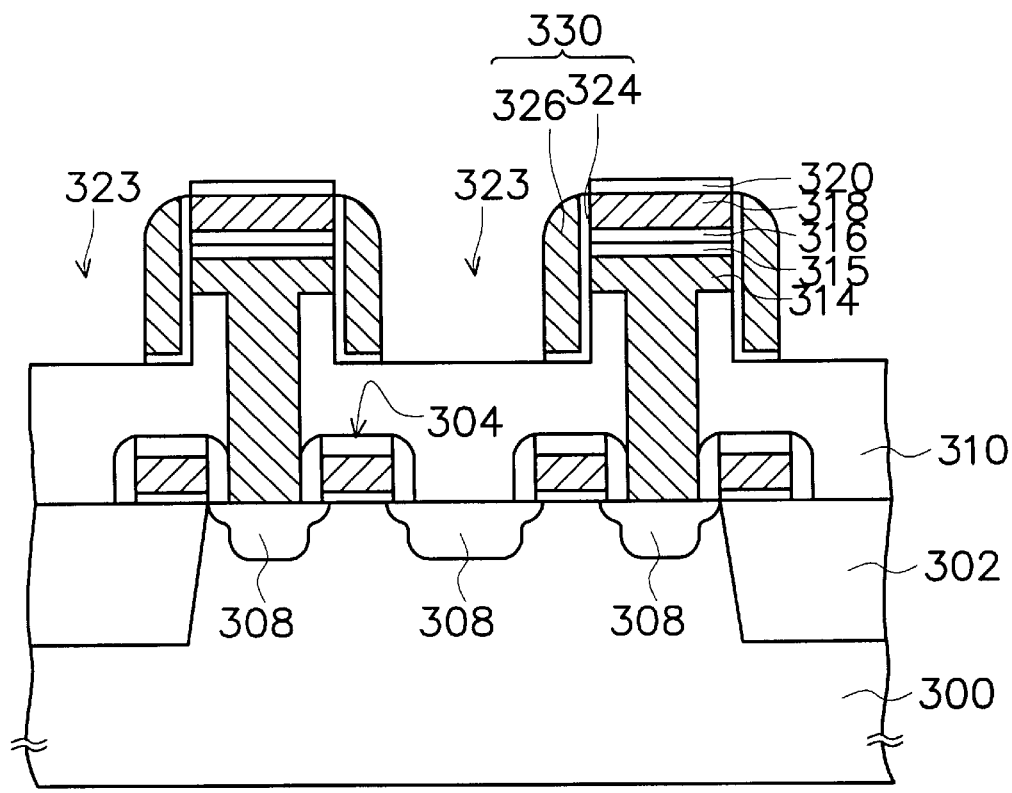

As shown in FIG. 3F, an anisotropic back etching operation is carried out to remove the barrier layer 324 together with the metallic layer 326 above the dielectric layer 310. Hence, the barrier layer 324 and the metallic layer 326 on the sidewalls of the polysilicon layer 314, the metal silicide layer 315, the barrier layer 316, the metallic layer 318 and the trench 323 turn into conductive spacers 330.

Figure 3G:
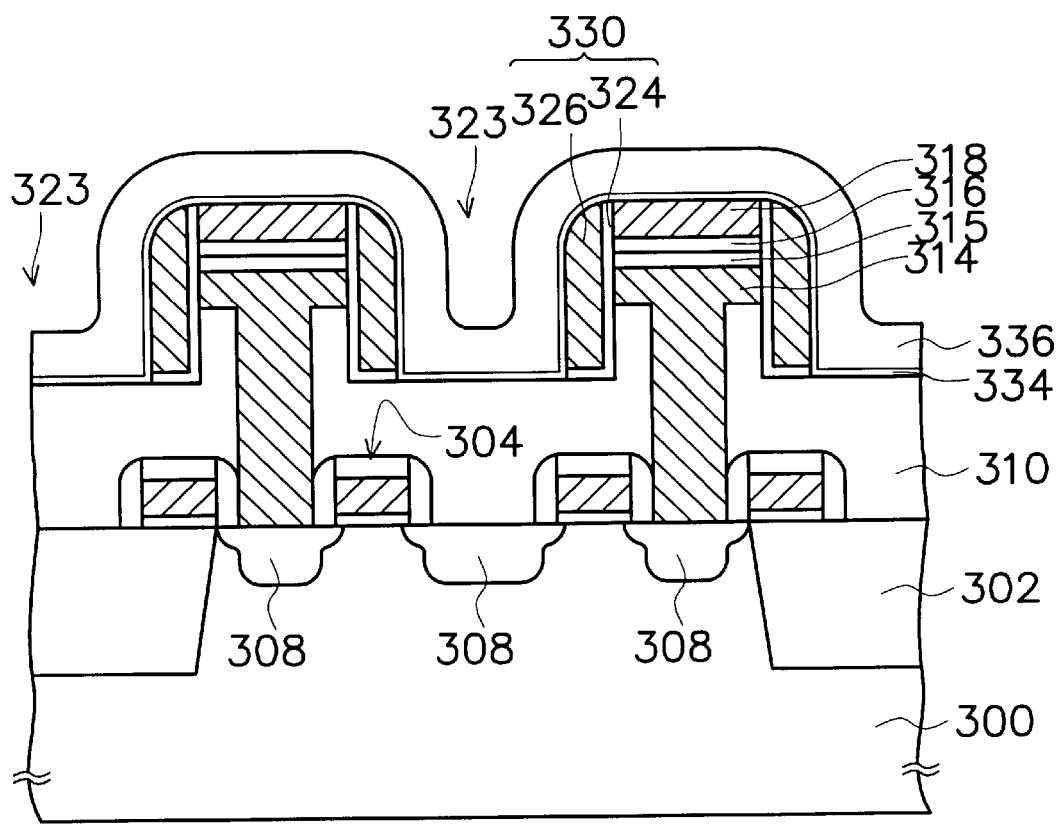

As shown in FIG. 3G, the hard mask layer 320 is removed to expose the lower electrode structure formed by the polysilicon layer 314, the metal silicide layer 315, the barrier layer 316, the metallic layer 318 and the conductive spacers 330. The method of removing the hard mask layer 320 includes a wet etching operation using, for example, hot phosphoric acid solution. Finally, a dielectric film layer 334 is formed over the substrate 300, and then a conductive layer 336 that serves as the upper electrode of the capacitor is formed above the dielectric film layer 334. High dielectric constant materials that can be used to form the dielectric film layer 334 includes tantalum pentoxide $Ta_2O_5$, Lead-Zirconium-Titanium oxide $Pb(Zr,Ti)O_3$ (PZT), and barium-strontium-titanium oxide $(Ba,Sr)TiO_3$ (BST). The conductive layer 336 can be an aluminum layer. Preferably, a titanium nitride layer, which serves as a barrier layer, is formed before the aluminum layer is deposited. Both the aluminum layer and the titanium nitride layer can be formed using, for example, a sputtering method.

In the second embodiment of this invention as described above, the capacitor has a metal-insulator-metal (MIM) structure with low interfacial reaction property. Hence, capacity of the capacitor is improved. Moreover, by filling the contact opening with polysilicon material, the leakage of current at the junction between the metallic layer and the source/drain region can be prevented. In addition, a high dielectric constant material such as tantalum pentoxide, BST and PZT can be used to form the dielectric film layer of the capacitor, and hence its storage capacity can be further increased.

In summary, the invention provides at least following advantages:

1. Deposition of a thick amorphous silicon layer is not required due to trench formation. Hence, time for depositing amorphous silicon is considerably reduced. Consequently, cost for operating a deposition oven is decreased and product throughput is increased. Moreover, the necessity of having to etch a rather thick amorphous silicon layer can be avoided.

2. The method for fabricating a capacitor in this invention is able to increase the overall surface area of its lower electrode. Hence, storage capacity of the capacitor is greatly increased.

3. A dielectric film layer having a high dielectric constant can be applied in this invention for increasing the capacitance of the capacitor further.

4. The capacitor of this invention can be a metal-insulator-metal structure. Hence, capacity of the capacitor is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a dynamic random access memory (DRAM), comprising the steps of:

providing a substrate having a field effect transistor thereon, wherein the field effect transistor includes a source/drain region;

forming a dielectric layer over the substrate;

forming a contact opening in the dielectric layer such that the contact opening exposes the source/drain region;

forming a first conductive layer over the substrate that fills the contact opening;

patterning the first conductive layer;

removing a portion of the exposed dielectric layer to form a trench;

forming conductive spacers on the sidewalls of the trench and the first conductive layer;

forming a dielectric film layer over the first conductive layer and the conductive spacers; and forming a second conductive layer over the dielectric film layer.

2. The method of claim 1, wherein the step of forming the first conductive layer and the conductive spacers includes depositing amorphous silicon.

3. The method of claim 2, wherein after the step of forming conductive spacers on the sidewalls of the trench and the first conductive layer but before forming the dielectric film layer over the first conductive layer and the conductive spacers, further includes forming selective hemispherical grained silicon over the surface of the first conductive layer and the conductive spacers.

4. The method of claim 1, wherein the step of patterning the first conductive layer and the step of forming a trench in the dielectric layer includes the sub-steps of:

forming a hard mask layer over the first conductive layer;

forming a photoresist layer over the hard mask layer;

patterning the hard mask layer and the photoresist layer;

etching the first conductive layer and the dielectric layer using the patterned photoresist layer and the hard mask layer as a mask; and removing the photoresist layer and the hard mask layer.

5. The method of claim 4, wherein the step of forming the first conductive layer and the conductive spacers includes depositing amorphous silicon.

6. The method of claim 5, wherein after the step of forming conductive spacers on the sidewalls of the trench and the first conductive layer but before forming the dielectric film layer over the first conductive layer and the conductive spacers, further includes forming selective hemispherical grained silicon over the surface of the first conductive layer and the conductive spacers.

7. The method of claim 1, wherein after the step of forming conductive spacers on the sidewalls of the trench and the first conductive layer but before forming the dielectric film layer over the first conductive layer and the conductive spacers, further includes forming selective hemispherical grained silicon over the surface of the first conductive layer and the conductive spacers.

8. A method for manufacturing dynamic random access memory (DRAM), comprising the steps of:

providing a substrate having a field effect transistor thereon, wherein the field effect transistor includes a source/drain region;

forming a dielectric layer over the substrate;

forming a contact opening in the dielectric layer such that the contact opening exposes the source/drain region;

forming a polysilicon layer over the substrate that fills the contact opening;

forming a first barrier layer over the polysilicon layer;

forming a first metallic layer over the first barrier layer;

patterning the polysilicon layer, the first barrier layer and the first metallic layer;

removing a portion of the exposed dielectric layer to form a trench;

forming a second barrier layer over the substrate;

forming a second metallic layer over the second barrier layer;

etching back the second metallic layer and the second barrier layer so that conductive spacers are formed on the sidewalls of the trench as well as the sidewalls of the polysilicon layer, the first barrier layer and the first metallic layer;

forming a dielectric film layer over the first metallic layer and the conductive spacers; and forming a conductive layer over the dielectric film layer.

9. The method of claim 8, wherein the step of forming the first metallic layer and the second metallic layer includes depositing ruthenium dioxide.

10. The method of claim 9, wherein the step of forming the first barrier layer and the second barrier layer includes depositing titanium nitride.

11. The method of claim 9, wherein after the step of forming the polysilicon layer but before the step of forming the first barrier layer, further includes forming a metal silicide layer, wherein the step of forming the first barrier layer and the second barrier layer includes depositing titanium nitride to form a titanium nitride layer first, followed by depositing ruthenium to later form a metallic ruthenium layer.

12. The method of claim 8, wherein the step of forming the dielectric film layer includes depositing a material chosen from a group consisting of tantalum pentoxide, BST and PZT.

13. The method of claim 12, wherein the step of forming the conductive layer includes depositing titanium nitride to form a titanium nitride layer first, and then depositing aluminum to form a metallic aluminum layer later.

14. The method of claim 8, wherein the step of forming the conductive layer includes depositing titanium nitride to form a titanium nitride layer first, and then depositing aluminum to form a metallic aluminum layer later.

15. The method of claim 8, wherein the step of patterning the polysilicon layer, the first barrier layer and the first metallic layer and the step of forming a trench in the dielectric layer further includes the sub-steps of:

forming a hard mask layer over the first metallic layer;

forming a photoresist layer over the hard mask layer;

patterning the photoresist layer and the hard mask layer;

etching the polysilicon layer, the first barrier layer, the first metallic layer and the dielectric layer using the patterned photoresist layer and the hard mask layer as a mask; and removing the photoresist layer and the hard mask layer.

16. The method of claim 15, wherein the step of forming the first metallic layer and the second metallic layer includes depositing ruthenium dioxide.

17. The method of claim 16, wherein the step of forming the first barrier layer and the second barrier layer includes depositing titanium nitride.

18. The method of claim 16, wherein after the step of forming the polysilicon layer but before the step of forming the first barrier layer, further includes forming a metal silicide layer, wherein the step of forming the first barrier layer and the second barrier layer includes depositing titanium nitride to form a titanium nitride layer first, followed by depositing ruthenium to form a metallic ruthenium layer later.

19. The method of claim 15, wherein the step of forming the dielectric film layer includes depositing a material chosen from a group consisting of tantalum pentoxide, BST and PZT.

20. The method of claim 15, wherein the step of forming the conductive layer includes depositing titanium nitride to form a titanium nitride layer first, and then depositing aluminum to form a metallic aluminum layer later.

* * * * *